(12) United States Patent
Fujimoto

(10) Patent No.: US 6,515,887 B2
(45) Date of Patent: Feb. 4, 2003

(54) SEMICONDUCTOR MEMORY DEVICE

(75) Inventor: Yukihiro Fujimoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/950,650

(22) Filed: Sep. 13, 2001

(65) Prior Publication Data

US 2002/0036943 A1 Mar. 28, 2002

(30) Foreign Application Priority Data

Sep. 25, 2000 (JP) ........................................ 2000-290933

(51) Int. Cl.[7] .............................. G11C 5/06; G11C 11/40
(52) U.S. Cl. ..................... 365/63; 365/154; 365/189.04; 365/190
(58) Field of Search .......................... 365/63, 154, 156, 365/190, 189.04, 230.03

(56) References Cited

U.S. PATENT DOCUMENTS

| | | | | |
|---|---|---|---|---|
| 4,839,862 A | * | 6/1989 | Shiba et al. ................. | 365/154 |
| 5,570,319 A | * | 10/1996 | Santoro et al. ............. | 365/190 |
| 5,675,529 A | * | 10/1997 | Poole ........................... | 365/149 |
| 6,058,065 A | * | 5/2000 | Lattimore et al. ...... | 365/230.03 |
| 6,091,629 A | | 7/2000 | Osada et al. ................ | 365/156 |

FOREIGN PATENT DOCUMENTS

JP    10-106269    4/1998

* cited by examiner

*Primary Examiner*—Son Mai
(74) *Attorney, Agent, or Firm*—Oblon, Spivak, McClelland, Maier & Neustadt, P.C.

(57) ABSTRACT

A semiconductor memory device according to the present invention comprises a memory cell array divided into a plurality of sub-arrays in each of which a specified number of storage elements are arranged in the row direction, a first bit line provided for each of the plurality of sub-arrays and connected to one of a pair of storage nodes complementary to each other in the specified number of storage elements, a second bit line to which the first bit line provided for each of the plurality of sub-arrays is commonly connected via switching means, a third bit line commonly connected to the other one of a pair of storage nodes complementary to each other in the specified number of storage elements in the plurality of sub-arrays, and a write circuit connected to the second bit line and the third bit line.

39 Claims, 6 Drawing Sheets

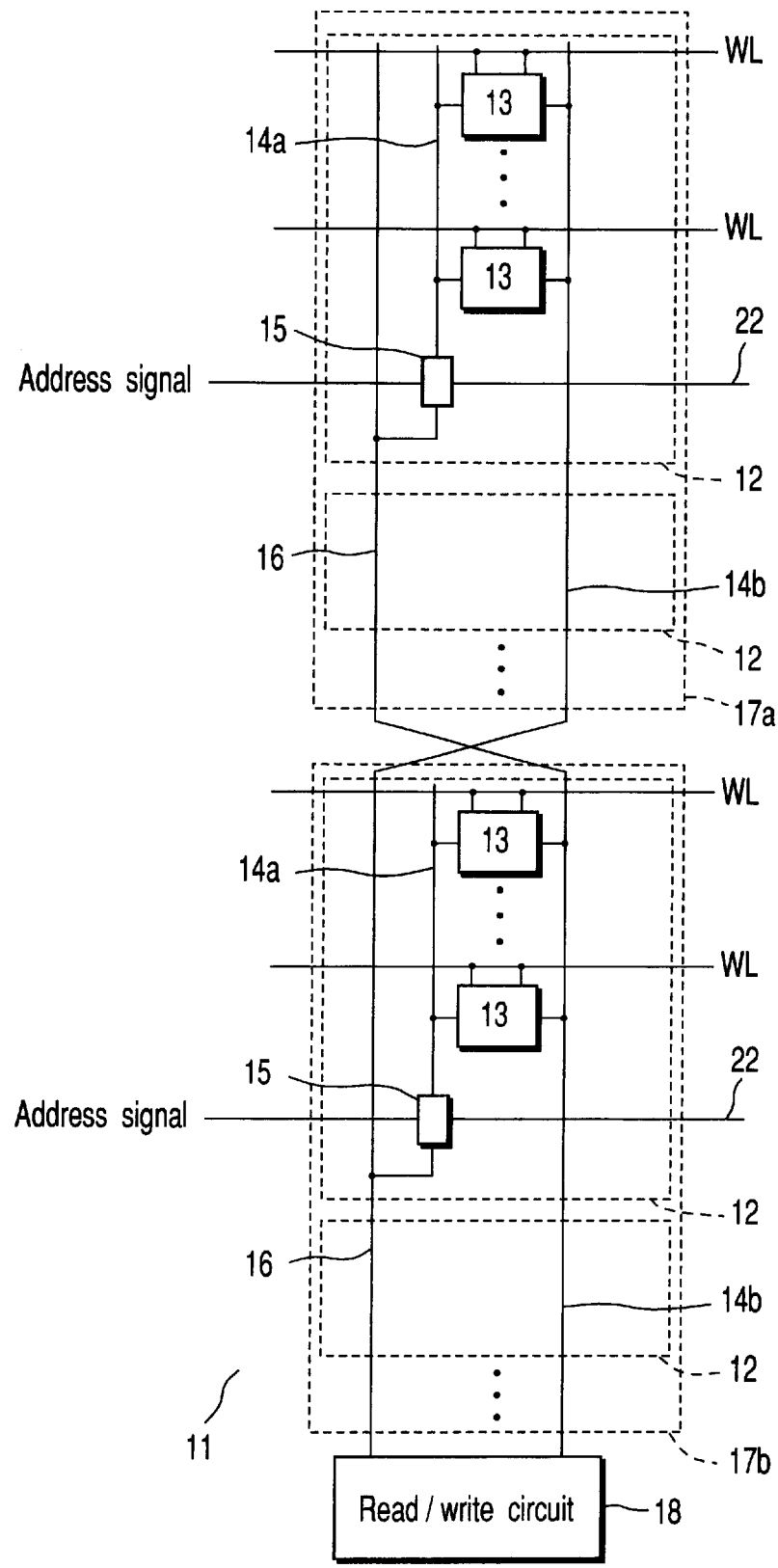
F I G. 1

SEMICONDUCTOR MEMORY DEVICE

CROSS-REFERENCE TO RELATED APPLICATIONS

This application is based upon and claims the benefit of priority from the prior Japanese Patent Application No. 2000-290933, filed Sep. 25, 2000, the entire contents of which are incorporated herein by reference.

BACKGROUND OF THE INVENTION

1. Field of the Invention

The present invention relates to a semiconductor memory device. More specifically, the present invention concerns an array structure of SRAM (static random access memory).

2. Description of the Related Art

In recent years, a semiconductor memory device is designed to increase a capacity and an operating speed in accordance with advancement of the micro-fabrication technology and a demand for improved system throughput. Particularly, there is a demand for SRAM built in a microprocessor to accelerate the cycle time and incorporate the multi-bit architecture along with improvement of the microprocessor's operating frequency and an increasing data bit width.

FIG. 6 exemplifies a conventional SRAM configuration (first conventional example). The SRAM uses a memory cell array 101 to arrange a plurality of memory cells 102 as storage elements in an array. The memory cell array 101 is provided with a plurality of word lines WL in a row direction and a plurality of pairs of bit lines BL and /BL in a column direction. Each memory cell 102 contains a pair of storage nodes (not shown) which are complementary to each other. The storage nodes are connected to each pair of bit lines BL and /BL via a switching circuit (not shown) which is connected to each word line WL. Each pair of bit lines BL and /BL is connected to a plurality of read/write circuits 103. Each word line WL is commonly connected to an address decoder 104.

An address signal is input to the SRAM. The address decoder 104 selects one of word lines WL. The selected word line WL is connected to a plurality of memory cells 102. The corresponding read/write circuits 103 each read or write data to the memory cells 102 via each pair of bit lines BL and /BL.

In this SRAM, each pair of bit lines BL and /DL is connected to many memory cells 102. Each pair of bit lines BL and /BL greatly increases a capacity load owing to capacities of a terminal and wiring connected to the storage node for each memory cell 102. From t he viewpoint of space saving, however, each memory cell 102 uses a small transistor consuming a little driving force. Normally, the switching circuit in each memory cell 102 comprises pass transistors based on N-type MOSFETS. Accordingly, each memory cell 102 transmits just a slight signal to each pair of bit lines BL and /BL.

Further, the read/write circuits 103 each are provided with a sense amplifier for amplifying a slight amplitude difference between each pair of bit lines BL and /BL. During a read operation, an electric potential level for a pair of bit lines BL and /BL is set (precharged) to the H level. A change in the electric potential level causes a read of data stored in each memory cell 102. During a write operation, the electric potential level (H level) for one of a pair of bit lines BL and /BL changes to the ground level (L level) according to the write data. A difference between the electric potential levels causes data to be written to each memory cell 102.

When a pair of bit lines BL and /BL is subject to a large capacity load, the thus configured SRAM needs to charge and discharge these bit lines within a clock cycle. There may be the case where write and read operations alternate successively. When the pair of bit lines BL and /BL changes to the L level during a write operation, it must be precharged completely until the next read operation starts. Since the read operation is a slight amplitude operation, an incomplete precharge causes malfunction. Namely, if the electric potential for a pair of bit lines BL and /BL does not reach the specified H level completely, an offset occurs on the pair of bit lines BL and /BL during a read operation, causing malfunction. The SRAM's operating frequency depends on the time for charging and discharging a pair of bit lines BL and /BL.

The thus configured SRAM causes a large capacity load on a pair of bit lines BL and /BL. Consequently, it is impossible to charge and discharge the pair of bit lines BL and /BL in a short time. It has been difficult to improve the operating frequency.

For decreasing the capacity load for a pair of bit lines, it just needs to decrease the number of memory cells connected to each pair of bit lines. If the SRAM should maintain the same storage capacity, the number of a pair of bit lines increases. This also increases circuits other than memory cells, thus increasing the SRAM area.

Hierarchizing a pair of bit lines is a known method for decreasing a capacity load on a pair of bit lines without increasing the SRAM area. FIG. 7 exemplifies another memory cell array configuration in the conventional SRAM (second conventional example).

In this configuration example, a memory cell array 201 is divided into a plurality of sub-arrays 202. The bit lines BL and /BL are hierarchized into a plurality of local bit lines 204 and a global bit line 205. The local bit lines 204 are connected to memory cells 203 in each sub-array 202. A plurality of local bit lines 204 is commonly connected to the global bit line 205.

The bit line is a bidirectional signal line. The local bit line 204 and the global bit line 205 are each connected via switching means 206 comprising pass transistors. Each switching means 206 is controlled by an address signal (decode output for sub-array selection) supplied via an address signal line 207. During a memory access, an address decoder (not shown) selects the memory cell 203 and the sub-array 202 which contains the memory cell 203. Further, the switching means 206 connects the local bit line 204 in the selected sub-array 202 to the global bit line 205. In this manner, data is read or written.

According to this configuration, the bit line's capacity load increases for the size of the sub-array 202. However, the terminal capacity for the memory cell 203 decreases to a reciprocal of the number of sub-arrays 202. Consequently, the total capacity load decreases, increasing the SRAM operating frequency.

However, this configuration requires four bit lines per memory cell 203. The size of each memory cell 203 is approximately four times as large as the wiring pitch. One of the four bit lines functions as a power supply line. In order to implement the SRAM in this example, the bit line requires two types of wiring layers. Though the capacity load on the bit line is reduced, a precharge to the global bit line 205 must be sufficiently performed after the write operation when write and read operations alternate successively. There has been the problem of restricting the operating frequency.

FIG. 8 exemplifies yet another memory cell array configuration in the conventional SRAM (third conventional example). The configuration example provides the global bit line for writing and reading in the memory cell array having the configuration as shown in FIG. 7.

In each sub-array 202 of memory cell array 201', one of local bit lines 204 is connected to a buffer circuit 210. Each buffer circuit 210 is commonly connected to a reading global bit line 212 which connects with a read circuit 211. The memory cell array 201' is configured to be a so-called single-end type in which the reading global bit line 212 is driven during a read operation. This configuration can decrease the number of bit lines.

Read and write operations can be performed independently by dividing the global bit line into the read function (212) and the write function (205). In this case, write and read operations coexist only on the local bit line 204. The precharge after write operation affects the operating frequency only on the local bit line 204 subject to a small capacity load. Further, a read operation uses a CMOS-level signal. Precharging the reading global bit line 212 just needs to set a logical value to the H level. Unlike another conventional example as mentioned above, it is needless to completely enable the H level. Accordingly, it is possible to shorten the precharge time and improve the operating frequency.

However, this configuration requires five bit lines per memory cell 203. It is necessary to further increase wiring layers (the number of hierarchies) for bit lines. Alternatively, the global bit line 205 needs to be wired in units of two memory cells by providing a column selector between the global bit line 205 and one of the local bit lines 204 in each sub-array 202. When the column selector is provided, two memory cells constitute a 1-bit data width. Namely, this has been a drawback that the data width must be halved.

Conventionally, the global bit line is provided for reading and writing to shorten the precharge time and improve the operating frequency. Contrarily, this increases the number of bit lines per memory cell. There have been drawbacks that wiring layers for the bit lines are increased and the data width must be halved when the column selector is provided.

BRIEF SUMMARY OF THE INVENTION

A semiconductor memory device according to an embodiment of the present invention comprises a memory cell array divided into a plurality of sub-arrays in each of which a specified number of storage elements are arranged in the row direction; a first bit line provided for each of the plurality of sub-arrays and connected to one of a pair of storage nodes complementary to each other in the specified number of storage elements; a second bit line to which the first bit line provided for each of the plurality of sub-arrays is commonly connected via switching means; a third bit line commonly connected to the other one of a pair of storage nodes complementary to each other in the specified number of storage elements in the plurality of sub-arrays; and a write circuit connected to the second bit line and the third bit line.

A semiconductor memory device according to an embodiment of the present invention comprises a memory cell array divided into a plurality of sub-arrays in each of which a specified number of storage elements are arranged in the row direction; a first bit line provided for each of the plurality of sub-arrays and connected to one of a pair of storage nodes complementary to each other in the specified number of storage elements; a second bit line to which the first bit line provided for each of the plurality of sub-arrays is commonly connected via first buffer means; a third bit line commonly connected to the other one of a pair of storage nodes complementary to each other in the specified number of storage elements in the plurality of sub-arrays; a write circuit connected to the second bit line and the third bit line; a fourth bit line to which the first bit line provided for each of the plurality of sub-arrays is commonly connected via second buffer means; and a read circuit connected to the fourth bit line.

BRIEF DESCRIPTION OF THE SEVERAL VIEWS OF THE DRAWING

FIG. 1 shows a configuration example of an SRAM memory cell array according to a first embodiment of the present invention;

DETAILED DESCRIPTION OF THE INVENTION

Embodiments of the present invention will be described in further detail with reference to the accompanying drawings.

First Embodiment

FIG. 1 shows a configuration example of a memory cell array in SRAM, one of semiconductor memory device according to the first embodiment of the present invention.

As shown in FIG. 1, a memory cell array 11 is divided into a plurality of sub-arrays 12 in the row direction. Each sub-array 12 contains a specified number of memory cells (storage elements) 13 arranged in the row direction. Each memory cell 13 connects with a word line WL.

Figure 2:
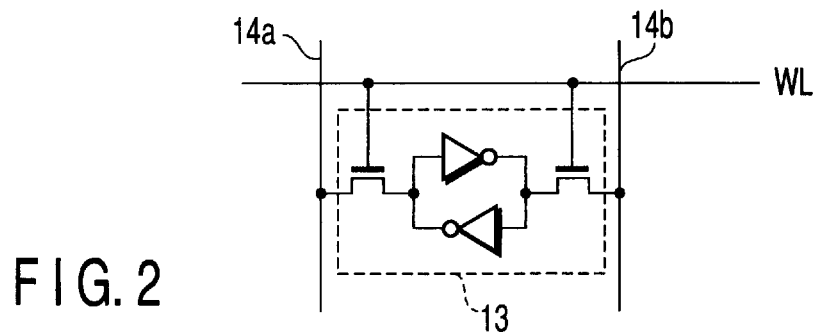
FIG. 2 shows a configuration example of a memory cell in the memory cell array shown in FIG. 1.

In each sub-array 12 as shown in FIG. 2, a local bit line (first bit line) 14a is connected to each of a specified number of memory cells 13 at one of terminals connected to a pair of storage nodes complementary to each other. A local bit line (third bit line) 14b is commonly connected to each of a specified number of memory cells 13 at the other one of terminals connected to a pair of storage nodes complementary to each other.

As shown in FIG. 1, the local bit line 14a in each sub-array 12 is commonly connected to a global bit line (second bit line) 16 via switching means 15.

Figure 3:
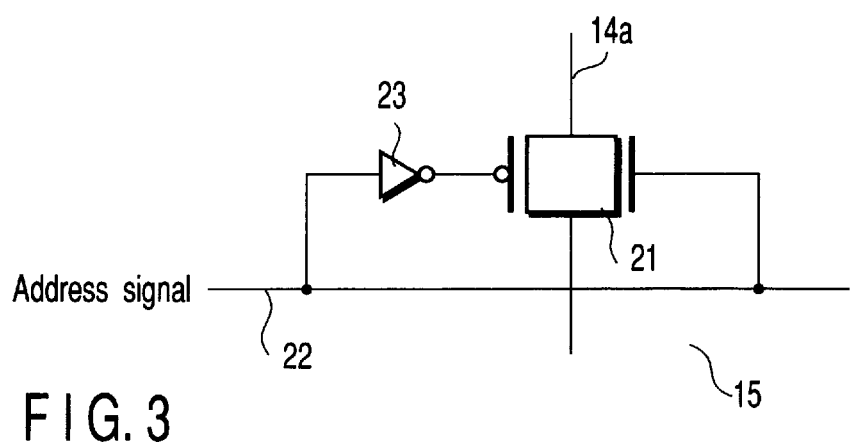
FIG. 3 shows a configuration example of switching means in the memory cell array shown in FIG. 1.

For example, the switching means 15 comprises a pass transistor 21 as shown in FIG. 3. The switching means 15 is given an address signal (decode output for sub-array selection) supplied via an address signal line 22 and is given a reverse signal of the address signal. The reverse signal is supplied via an inverter circuit 23. The switching means 15 is configured to control on/off states of the pass transistor 21 by using the address signal and its reverse signal. It is also possible to configure the switching means 15 by using a tri-state buffer.

As shown in FIG. 1, the plurality of sub-arrays 12 constitutes a plurality of (two in this case) sub-array groups 17a and 17b. A global bit line 16 in the sub-array group 17a is connected to a local bit line 14b in the sub-array group 17b adjacent to the sub-array group 17a. The local bit line 14b in the sub-array group 17a is connected to the global bit line 16 in the sub-array group 17b. The global bit line 16 and the local bit line 14b are connected to a read/write circuit 18.

During a data read operation in the above-mentioned configuration, supplying an address signal activates each memory cell 13 in a give sub-array 12. This turns on the switching means 15 in the sub-array 12 containing memory cells 13 to be activated. The memory cell 13 connects with a word line WL selected by the address decoder (not shown). Complementary data is read from the memory cell 13 via the local bit line 14a, the global bit line 16, and the local bit line 14b. The read data is supplied to the read/write circuit 18.

Also during a write operation, similar operations are performed to turn on the switching means 15 in the sub-array 12 containing memory cells 13 to be activated. In this state, the read/write circuit 18 supplies write data to the memory cell 13 via the global bit line 16, the local bit line 14a, and the local bit line 14b.

During read and write operations, the memory cell 13 to be activated is contained in the sub-array 12 belonging to the sub-array group which is, say, one of the sub-array group 17a and 17b. The global bit line 16 is provided in the sub-array group. Another global bit line 16 is available having no electric connection with the former global bit line 16 and is used for another sub-array group, say, the other one of the sub-array group 17a and 17b. During the operation, the switching means 15 of the intended sub-array 12 in the sub-array group turns on. It is to be noted that all memory cells 13 in the sub-array 12 should be inactive. Hence, it is possible to almost balance a capacity load between two bit lines 14b and 16.

Figure 6:
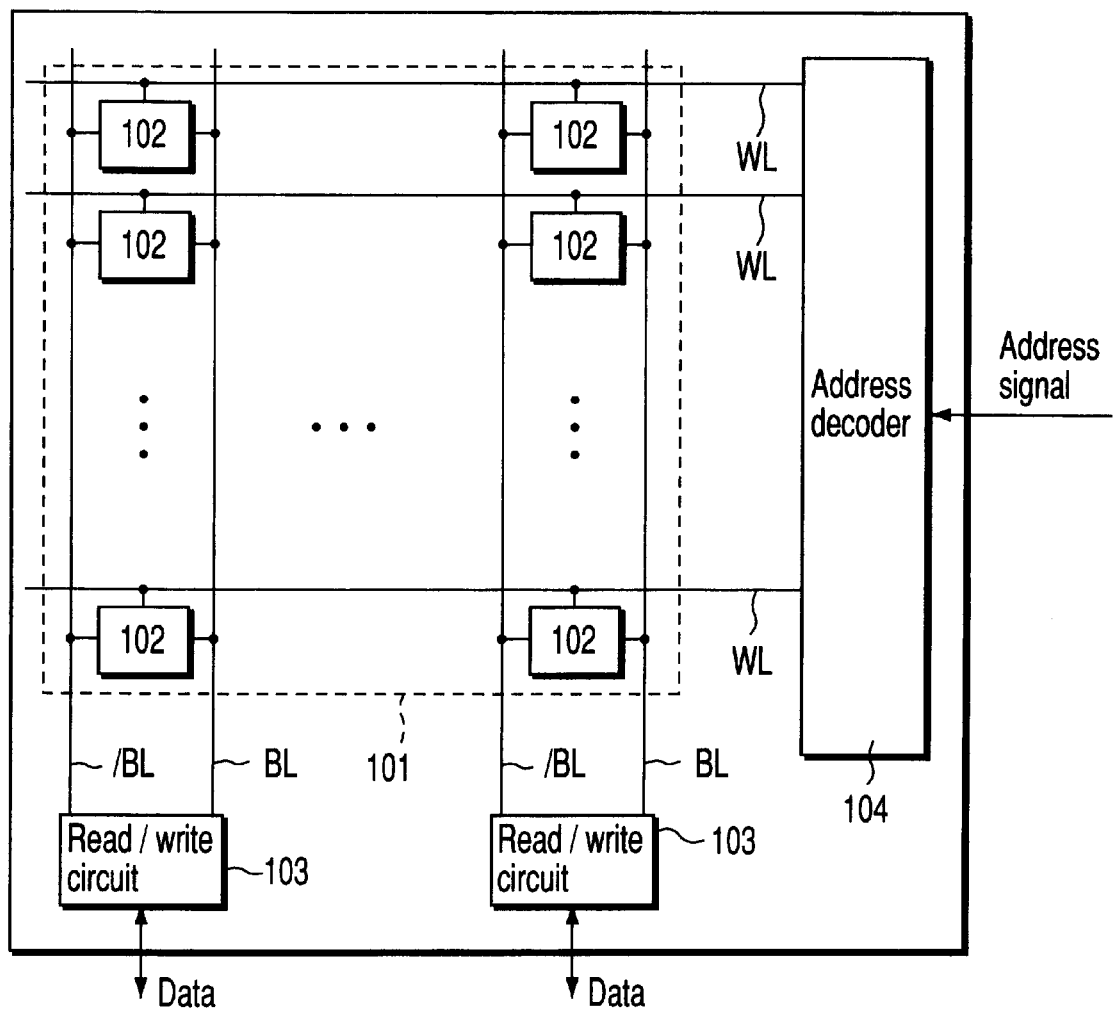
FIG. 6 shows a configuration example of conventional SRAM.
Figure 7:
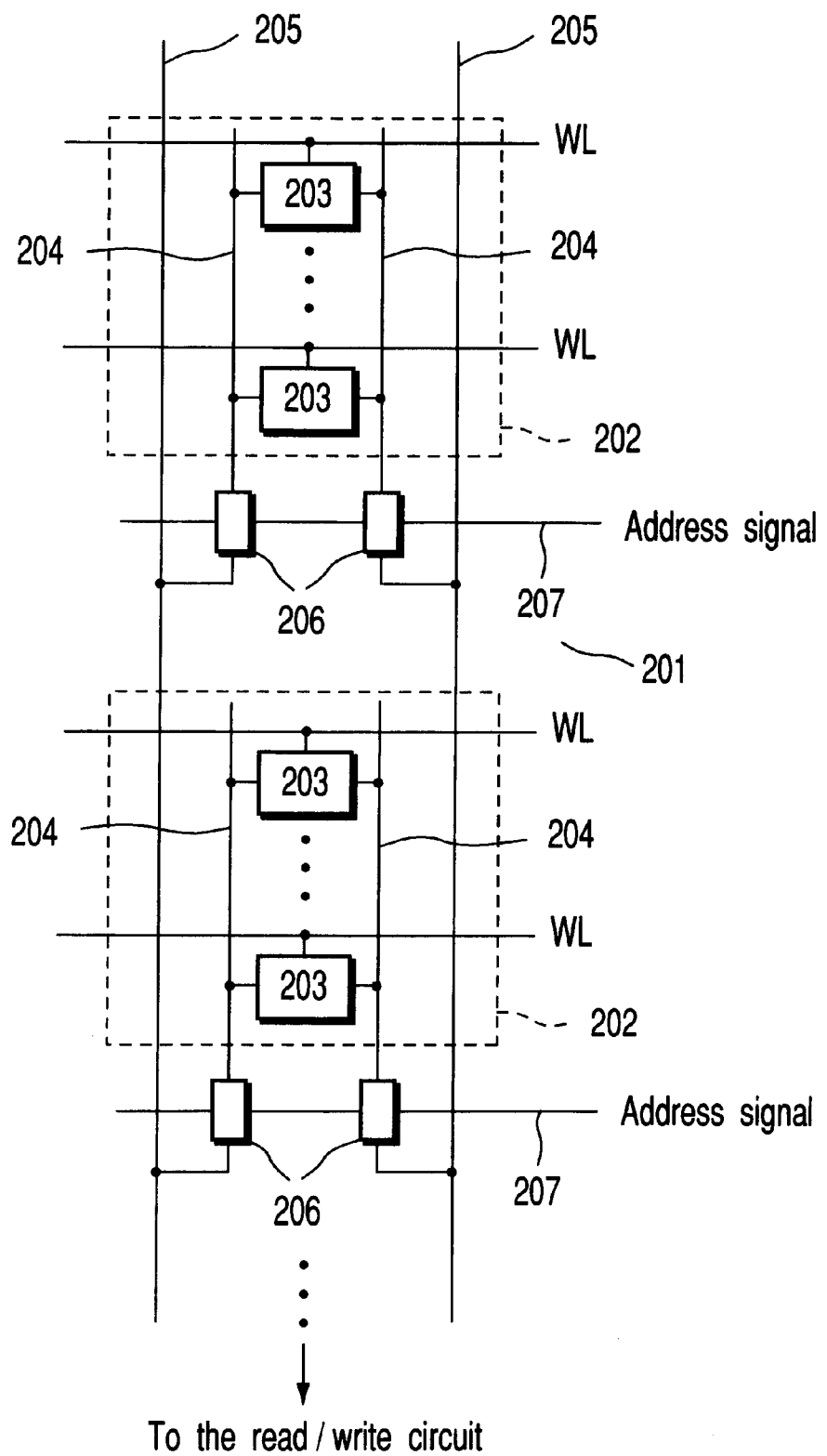
FIG. 7 shows a configuration example of a memory cell array in another conventional SRAM.

In this configuration, a wiring capacity for the global bit line 16 is almost the same as for the first and second conventional examples shown in FIGS. 6 and 7, respectively. However, the configuration halves the number of memory cells 13 directly connected to the global bit line 16. Accordingly, the terminal capacity for the memory cell 13 becomes approximately half the first conventional example, increasing the terminal capacity for the switching means 15 and the capacity for the local bit line 14a in each sub-array 12. Terminals of the switching means 15 are fewer than the memory cells 13. Accordingly, the switching means 15 can be given a small terminal capacity. Each sub-array 12 contains a small number of memory cells 13 connected to the local bit line 14a. Therefore, the bit line 14a can be given a small capacity.

When there are provided 256 memory cells in the row direction, for example, the first conventional example needs the following bit line capacity viewed from the read/write circuit: "the wiring capacity of the global bit line (equivalent to the length for 256 memory cells)"+"the capacity of 256 memory cells connected to the global bit line".

By contrast, the configuration according to the first embodiment of the present invention uses, say, two sub-array groups, 16 sub-arrays, and 16 memory cells in each sub-array. In this configuration, the bit line capacity viewed from the read/write circuit is expressed as follows: "the wiring capacity of the global bit line (equivalent to the length for 256 memory cells)"+"the capacity of 128 (=256/2) memory cells connected to the global bit line"+"the capacity of eight (=16/2) switching means connected to the global bit line"+"the capacity for the local bit line in one selected sub-array (equivalent to $\frac{1}{16}$ of the bit line capacity viewed from the read/write circuit in the first conventional example)".

It is possible to decrease the increased capacity for eight switching means and the local bit line in proportion to a decrease in the memory cell capacity (halved from 256 to 128 memory cells). Accordingly, the configuration according to the first embodiment of the present invention can decrease the bit line capacity viewed from the read/write circuit compared to the first conventional example. Capacity loads on the bit lines 14a, 14b, and 16 become smaller than those for the first conventional example, improving the SRAM operating frequency.

The configuration according to the first embodiment just needs three bit lines 14a, 14b, and 16 per memory cell. Just a single wire is added for the memory cell width. Consequently, it is possible to provide a bit line by using the twofold wiring layer without adding a new wiring layer due to the memory cell width or the wiring pitch.

Figure 4:
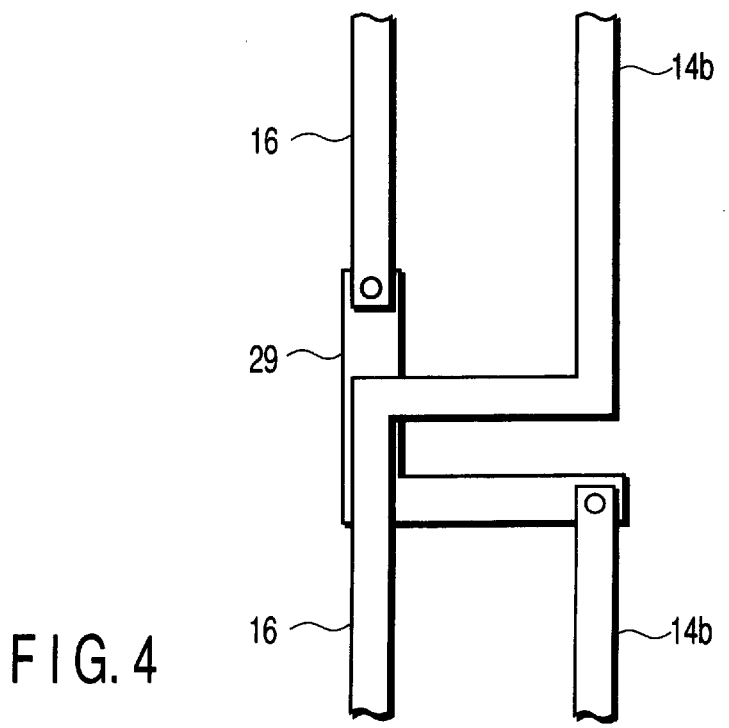
FIG. 4 shows a connection example of bit lines in the memory cell array shown in FIG. 1.

For example, FIG. 4 shows a connection between the local bit line 14b and the global bit line 16 in a crossing manner by using wiring 29 on a layer lower than the bit lines 14b and 16. In this case, it is also possible to provide the bit lines 14b and 16 on a single wiring layer. This configuration can easily hierarchize bit lines according to needs and decrease the bit line capacity, providing the SRAM with a high operating frequency.

Second Embodiment

Figure 5:
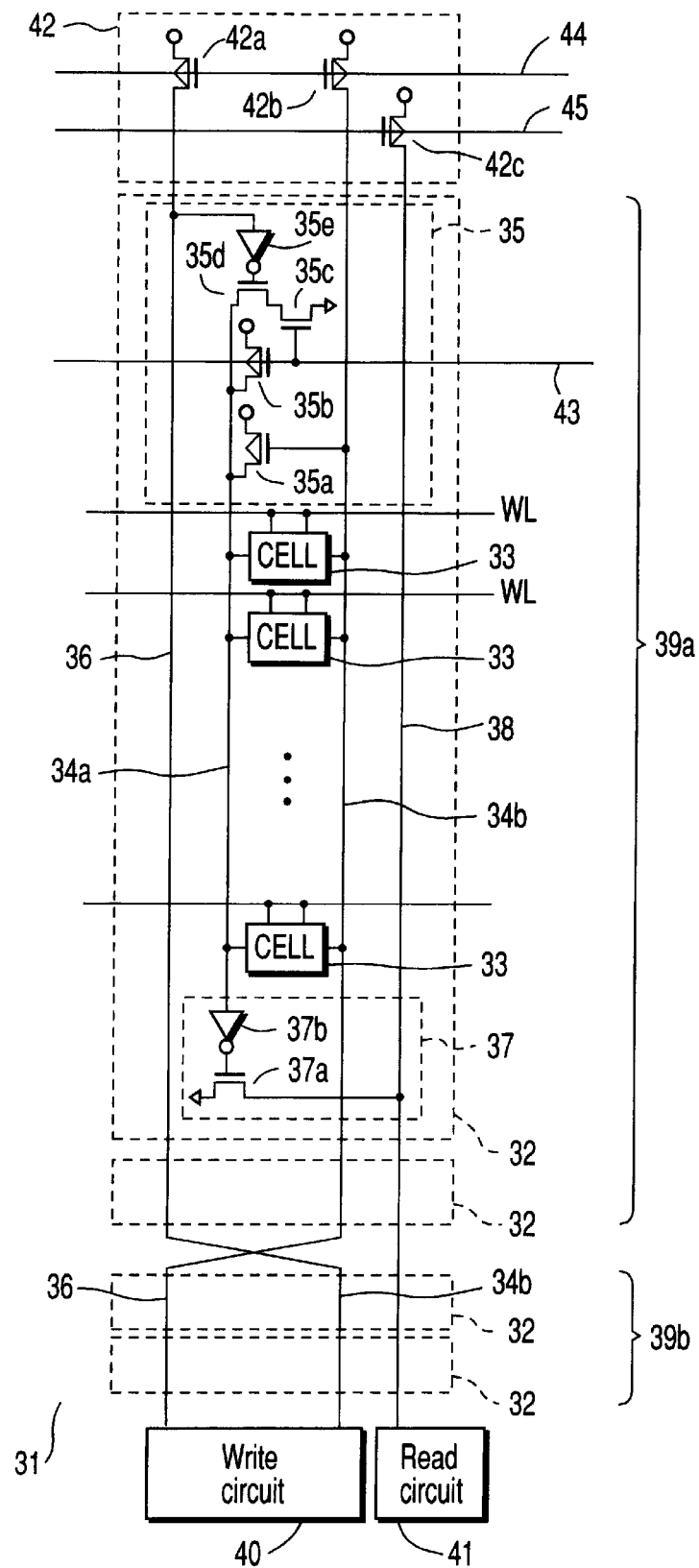
FIG. 5 shows a configuration example of an SRAM memory cell array according to a second embodiment of the present invention.

FIG. 5 shows a configuration example of an SRAM memory cell array according to the second embodiment of the present invention.

As shown in FIG. 5, a memory cell array 31 is divided into a plurality of (four in this case) sub-arrays 32. Each sub-array 32 contains a specified number of memory cells (storage elements) 33 arranged in the row direction. Each memory cell 33 connects with a word line WL.

Like the memory cells 13 in FIG. 2, a local bit line (first bit line) 34a is connected to each of a specified number of memory cells 33 in each sub-array 32 at one of terminals connected to a pair of storage nodes complementary to each other. A local bit line (third bit line) 34b is commonly connected to each of a specified number of memory cells 33 at the other one of terminals connected to a pair of storage nodes complementary to each other.

A local bit line 34a in each sub-array 32 is commonly connected to a write global bit line (second bit line) 36 via a write buffer circuit (first buffer means) 35 and is connected to a local bit line 34b. The local bit line 34a is commonly connected to a read global bit line (fourth bit line) 38 via a read buffer circuit (second buffer means) 37.

The plurality of sub-arrays 32 constitutes a plurality of (two in this case) sub-array groups 39a and 39b. The write global bit line 36 for the sub-array group 39a is connected to the local bit line 34b for the sub-array group 39b adjacent to the sub-array group 39a. The local bit line 34b for the sub-array group 39a is connected to the write global bit line 36 for the sub-array group 39b. One end of each of the write global bit line 36 and the local bit line 34b is connected to a write circuit 40. One end of the read global bit line 38 is connected to a read circuit 41. The other end of each of the read global bit line 38, the write global bit line 36, and the local bit line 34b is connected to a precharge circuit 42.

The write buffer circuit 35 comprises p-channel MOS transistors 35a and 35b, n-channel MOS transistors 35c and 35d, and an inverter circuit 35e. In the p-channel MOS transistor 35a, the gate is connected to the local bit line 34b. The drain is connected to the local bit line 34a. The source is connected to the power supply. In the p-channel MOS transistor 35b, the gate is connected to a local bit line precharge signal (address signal) line 43. The drain is connected to the local bit line 34a. The source is connected to the power supply. In the n-channel MOS transistor 35c, the gate is connected to a local bit line precharge signal (address signal) line 43. The drain is connected to the source of the n-channel MOS transistor 35d. The source is grounded. In the n-channel MOS transistor 35d, the gate is connected to an output terminal of the inverter circuit 35e. The drain is connected to the local bit line 34a. The source is connected to the drain of the n-channel MOS transistor 35c. In the inverter circuit 35d, an input terminal is connected to the write global bit line 36. An output terminal is connected to the gate of the n-channel MOS transistor 35d.

The read buffer circuit 37 comprises an n-channel MOS transistor 37a and an inverter circuit 37b. In the n-channel MOS transistor 37a, the gate is connected to an output terminal of the inverter circuit 37b.

The drain is connected to the read global bit line 38. The source is grounded. In the inverter circuit 37b, an input terminal is connected to the local bit line 34a. An output terminal is connected to the gate of the n-channel MOS transistor 37a.

The SRAM according to the second embodiment configures switching means comprising a tri-state buffer by using the p-channel MOS transistor 35b of the write buffer circuit 35 and the read buffer circuit 37.

The precharge circuit 42 comprises, say, p-channel MOS transistors 42a, 42b, and 42c. In the p-channel MOS transistor 42a, the gate is connected to a writing bit line precharge signal line 44. The drain is connected to the write global bit line 36. The source is connected to the power supply. In the p-channel MOS transistor 42b, the gate is connected to a writing bit line precharge signal line 44. The drain is connected to the local bit line 34b. The source is connected to the power supply. In the p-channel MOS transistor 42c, the gate is connected to a reading bit line precharge signal line 45. The drain is connected to the read global bit line 38. The source is connected to the power supply.

In this configuration, an address signal functioning as a precharge signal for the local bit lines 34a and 34b goes to the H level to select one of sub-arrays 32. The write buffer circuit 35 in the selected sub-array 32 drives the local bit line 34a according to data on the write global bit line 36. During a write operation, the write circuit 40 changes a potential for one of precharged bit lines 34a and 34b to the L level. Thus, data is written to the selected memory cell 33 only via the local bit line 34b or via the global bit line 36 and the local bit line 34a.

During a read operation, the word line WL activates one of memory cells 33 in each column. The local bit line 34a corresponds to the sub-array 32 containing the activated memory cell 33. When the potential for the local bit line 34a goes to the L level, the read buffer circuit 37 changes the potential for the read global bit line 38 from the already precharged H level to the L level. Thus, the local bit line 34a and the read global bit line 38 read data from the memory cell 33 and supply the read data to the read circuit 41.

Figure 8:
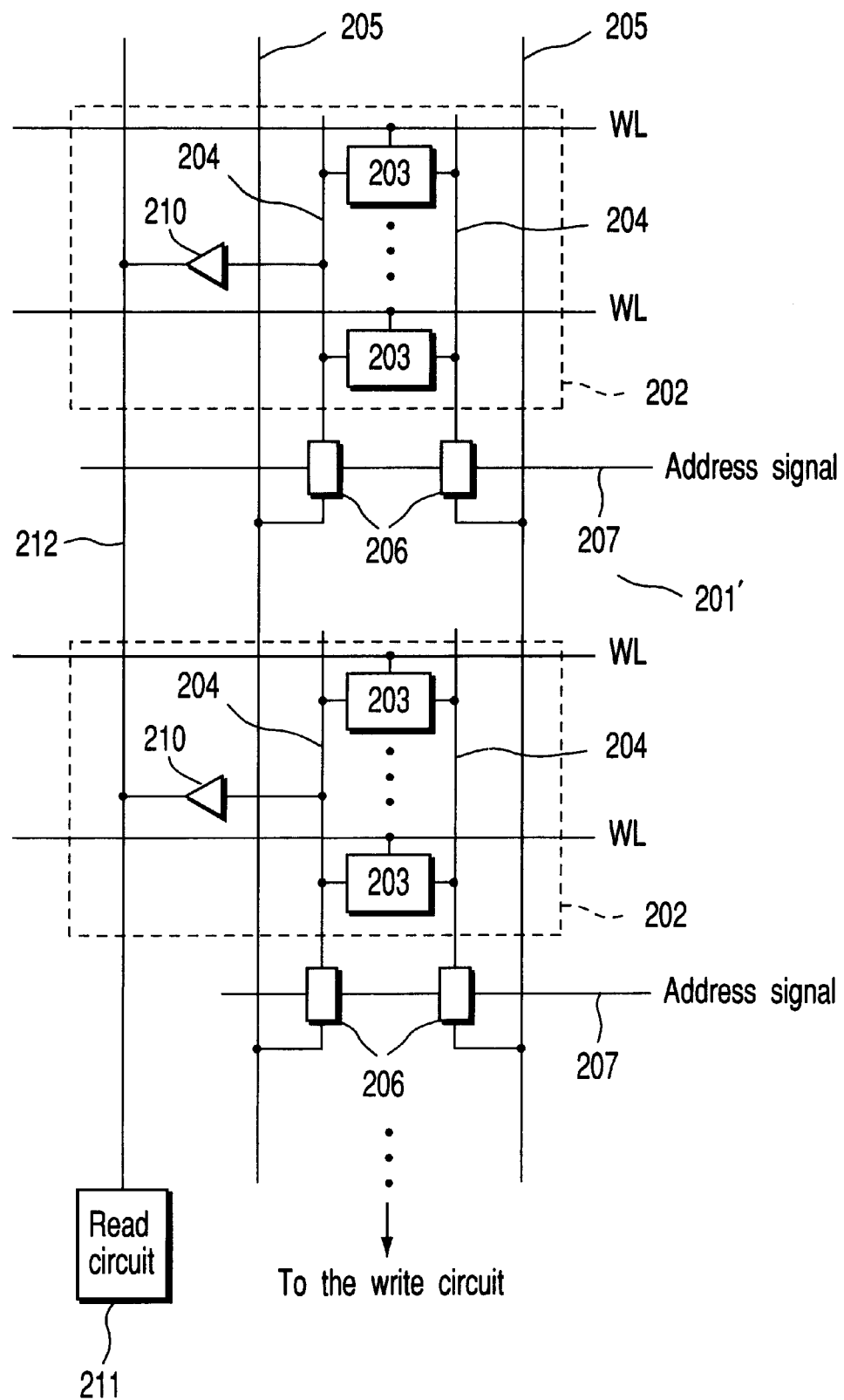
FIG. 8 shows a configuration example of a memory cell array in yet another conventional SRAM.

As mentioned above, the configuration according to the second embodiment uses different global bit lines for write and read operations. Even if write and read operations occur successively as described for the third conventional example in FIG. 8, the global bit lines are charged and discharged independently. The bit line load capacity affecting read operations is almost the same as for the third conventional example, keeping the read speed unchanged. Accordingly, the bit line load capacity does not restrict the operating frequency.

Further, a read operation takes place at the CMOS level. Just logically enabling the H level eliminates the need for a complete precharge. Accordingly, it is possible to shorten the precharge time and improve the operating frequency.

Especially, compared to the third conventional example, it is possible to decrease the number of bit lines per memory cell. Just adding one wiring layer realizes easy configuration. Accordingly, it is possible to configure the SRAM featuring a 1-bit data width per memory cell, providing a multi-bit, fast SRAM chip.

This configuration can easily hierarchize bit lines just by adding a minimal number of wiring layers. Further, the configuration can increase the operating frequency and provide a multi-bit SRAM chip.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:

a memory cell array having first and second sub-arrays in each of which a plurality of memory cells, each of the memory cells having a first node and a second node which is complementary to the first node, are arranged;

a first bit line provided for each of said first and second sub-arrays and connected to the first node of the memory cells;

a second bit line connected commonly to the first bit line via a switching circuit;

a third bit line commonly connected to the second node of the memory cells in said first and second sub-arrays; and a write circuit connected to said second bit line and said third bit line, wherein said first and second sub-arrays are included in first and second sub-array groups, respectively;

said second bit line in said first sub-array group is connected to said third bit line in said second sub-array group; and said third bit line in said first sub-array group is connected to said second bit line in said second sub-array group.

2. A semiconductor memory device comprising:

a memory cell array having first and second sub-arrays in each of which a plurality of memory cells, each of the memory cells having a first node and a second node which is complementary to the first node, are arranged;

a first bit line provided for each of said first and second sub-arrays and connected to the first node of the memory cells;

a second bit line connected commonly to the first bit line via a switching circuit;

a third bit line commonly connected to the second node of the memory cells in said first and second sub-arrays; and a write circuit connected to said second bit line and said third bit line, wherein said first and second sub-arrays are included in first and second sub-array groups, respectively, said second bit line in said first sub-array group is connected to said third bit line in said second sub-array group, said third bit line in said first sub-array group is connected to said second bit line in said second sub-array group, and wherein there is a crossing between a connection of said second bit line in said first sub-array group with said third bit line in said second sub-array group and a connection of said third bit line in said first sub-array group with said second bit line in said second sub-array group.

3. A semiconductor memory device comprising:

a memory cell array having first and second sub-arrays in each of which a plurality of memory cells, each of the memory cells having a first node and a second node which is complementary to the first node, are arranged;

a first bit line provided for each of said first and second sub-arrays and connected to the first node of the memory cells;

a second bit line connected commonly to the first bit line via a switching circuit;

a third bit line commonly connected to the second node of the memory cells in said first and second sub-arrays; and a write circuit connected to said second bit line and said third bit line, wherein said first and second sub-arrays are included in first and second sub-array groups, respectively, said second bit line in said first sub-array group is connected to said third bit line in said second sub-array group, said third bit line in said first sub-array group is connected to said second bit line in said second sub-array group, and wherein there is a crossing between a connection of said second bit line in said first sub-array group with said third bit line in said second sub-array group and a connection of said third bit line in said first sub-array group with said second bit line in said second sub-array group by using a wiring layer differing from said second and third bit lines in said first sub-array group and said second and third bit lines in said second sub-array group.

4. A semiconductor memory device comprising:

a memory cell array having first and second sub-arrays in each of which a plurality of memory cells, each of the memory cells having a first node and a second node which is complementary to the first node, are arranged;

a first bit line provided for each of said first and second sub-arrays and connected to the first node of the memory cells;

a second bit line connected commonly to the first bit line via a switching circuit;

a third bit line commonly connected to the second node of the memory cells in said first and second sub-arrays; and a write circuit connected to said second bit line and said third bit line, wherein said first and second sub-arrays are included in first and second sub-array groups, respectively, said second bit line in said first sub-array group is connected to said third bit line in said second sub-array group, said third bit line in said first sub-array group is connected to said second bit line in said second sub-array group, and wherein there is a crossing between a connection of said second bit line in said first sub-array group with said third bit line in said second sub-array group and a connection of said third bit line in said first sub-array group with said second bit line in said second sub-array group by using a wiring layer lower than said second and third bit lines in said first sub-array group and said second and third bit lines in said second sub-array group.

5. A semiconductor memory device comprising:

a memory cell array having first and second sub-arrays in each of which a plurality of memory cells, each of the memory cells having a first node and a second node which is complementary to the first node, are arranged;

a first bit line provided for each of said first and second sub-arrays and connected to the first node of the memory cells;

a second bit line connected commonly to the first bit line via a switching circuit;

a third bit line commonly connected to the second node of the memory cells in said first and second sub-arrays; and a write circuit connected to said second bit line and said third bit line, wherein said first and second sub-arrays are included in first and second sub-array groups, respectively, said second bit line in said first sub-array group is connected to said third bit line in said second sub-array group, said third bit line in said first sub-array group is connected to said second bit line in said second sub-array group, wherein there is a crossing between a connection of said second bit line in said first sub-array group with said third bit line in said second sub-array group and a connection of said third bit line in said first sub-array group with said second bit line in said second sub-array group, and wherein a wiring layer on the same layer implements said second and third bit lines in said first sub-array group and said second and third bit lines in said second sub-array group.

6. The semiconductor memory device according to claim 1, wherein a read circuit is further connected to said second bit line and said third bit line.

7. The semiconductor memory device according to claim 1, wherein said switching circuit comprises a pass transistor controlled by an address signal.

8. The semiconductor memory device according to claim 1, wherein said switching circuit comprises a tri-state buffer controlled by an address signal.

9. A semiconductor memory device comprising:

a memory cell array having first and second sub-arrays in each of which a plurality of memory cells, each of the memory cells having a first node and a second node which is complementary to the first node, are arranged;

a first bit line provided for each of said first and second sub-arrays and connected to the first node of the memory cells;

a second bit line connected commonly to the first bit line via a switching circuit;

a third bit line commonly connected to the second node of the memory cells in said first and second sub-arrays; and a write circuit connected to said second bit line and said third bit line, wherein said first bit line provided for each of said first and second sub-arrays further comprises a fourth bit line commonly connected via a buffer circuit; and a read circuit connected to said fourth bit line.

10. The semiconductor memory device according to claim 1, which is a static random access memory (SRAM).

11. A semiconductor memory device comprising:

a memory cell array divided into a plurality of sub-arrays in each of which a specified number of storage elements are arranged in the row direction;

a first bit line provided for each of said plurality of sub-arrays and connected to one of a pair of storage nodes complementary to each other in said specified number of storage elements;

a second bit line to which said first bit line provided for each of said plurality of sub-arrays is commonly connected via a first buffer circuit;

a third bit line commonly connected to the other one of a pair of storage nodes complementary to each other in said specified number of storage elements in said plurality of sub-arrays;

a write circuit connected to said second bit line and said third bit line;

a fourth bit line to which said first bit line provided for each of said plurality of sub-arrays is commonly connected via a second buffer circuit; and a read circuit connected to said fourth bit line.

12. The semiconductor memory device according to claim 11, wherein said plurality of sub-arrays in said memory cell array comprises at least first and second sub-array groups;

said second bit line in said first sub-array group is connected to said third bit line in said second sub-array group; and said third bit line in said first sub-array group is connected to said second bit line in said second sub-array group.

13. The semiconductor memory device according to claim 12, wherein there is a crossing between a connection of said second bit line in said first sub-array group with said third bit line in said second sub-array group and a connection of said third bit line in said fist sub-array group with said second bit line in said second sub-array group.

14. The semiconductor memory device according to claim 13, wherein there is a crossing between a connection of said second bit line in said first sub-array group with said third bit line in said second sub-array group and a connection of said third bit line in said first sub-array group with said second bit line in said second sub-array group by using a wiring layer differing from said second and third bit lines in said first sub-array group and said second and third bit lines in said second sub-array group.

15. The semiconductor memory device according to claim 13, wherein there is crossing between a connection of said second bit line in said first sub-array group with said third bit line in said second sub-array group and a connection of said third bit line in said first sub-array group with said second bit line in said second sub-array group by using a wiring layer lower than said second and third bit lines in said first sub-array group and said second and third bit lines in said second sub-array group.

16. The semiconductor memory device according to claim 13, wherein a wiring layer on the same layer implements said second and third bit lines in said first sub-array group and said second and third bit lines in said second sub-array group.

17. The semiconductor memory device according to claim 11, wherein a precharge circuit is each connected to one end of said second, third, and fourth bit lines.

18. The semiconductor memory device according to claim 11, wherein said memory cell array is divided into a plurality of sub-arrays in the row direction.

19. The semiconductor memory device according to claim 11, which is a static random access memory (SRAM).

20. The semiconductor memory device according to claim 2, wherein a read circuit is further connected to said second bit line and said third bit line.

21. The semiconductor memory device according to claim 2, wherein said switching circuit comprises a pass transistor controlled by an address signal.

22. The semiconductor memory device according to claim 2, wherein said switching circuit comprises a tri-state buffer controlled by an address signal.

23. The semiconductor memory device according to claim 2, which is a static random access memory (SRAM).

24. The semiconductor memory device according to claim 3, wherein a read circuit is further connected to said second bit line and said third bit line.

25. The semiconductor memory device according to claim 3, wherein said switching circuit comprises a pass transistor controlled by an address signal.

26. The semiconductor memory device according to claim 3, wherein said switching circuit comprises a tri-state buffer controlled by an address signal.

27. The semiconductor memory device according to claim 3, which is a static random access memory (SRAM).

28. The semiconductor memory device according to claim 4, wherein a read circuit is further connected to said second bit line and said third bit line.

29. The semiconductor memory device according to claim 4, wherein said switching circuit comprises a pass transistor controlled by an address signal.

30. The semiconductor memory device according to claim 4, wherein said switching circuit comprises a tri-state buffer controlled by an address signal.

31. The semiconductor memory device according to claim 4, which is a static random access memory (SRAM).

32. The semiconductor memory device according to claim 5, wherein a read circuit is further connected to said second bit line and said third bit line.

33. The semiconductor memory device according to claim 5, wherein said switching circuit comprises a pass transistor controlled by an address signal.

34. The semiconductor memory device according to claim 5, wherein said switching circuit comprises a tri-state buffer controlled by an address signal.

35. The semiconductor memory device according to claim 5, which is a static random access memory (SRAM).

36. The semiconductor memory device according to claim 9, wherein a read circuit is further connected to said second bit line and said third bit line.

37. The semiconductor memory device according to claim 9, wherein said switching circuit comprises a pass transistor controlled by an address signal.

38. The semiconductor memory device according to claim 9, wherein said switching circuit comprises a tri-state buffer controlled by an address signal.

39. The semiconductor memory device according to claim 9, which is a static random access memory (SRAM).

* * * * *